US012606934B2

(12) United States Patent
Ueta et al.

(10) Patent No.: US 12,606,934 B2
(45) Date of Patent: Apr. 21, 2026

(54) GROUP III NITRIDE CRYSTAL, GROUP III NITRIDE SEMICONDUCTOR, GROUP III NITRIDE SUBSTRATE, AND METHOD FOR PRODUCING GROUP III NITRIDE CRYSTAL

(71) Applicant: Panasonic Intellectual Property Management Co., Ltd., Osaka (JP)

(72) Inventors: Akio Ueta, Hyogo (JP); Hiroshi Ohno, Osaka (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 257 days.

(21) Appl. No.: 18/457,440

(22) Filed: Aug. 29, 2023

(65) Prior Publication Data

US 2023/0399770 A1 Dec. 14, 2023

Related U.S. Application Data

(63) Continuation of application No. PCT/JP2022/008951, filed on Mar. 2, 2022.

(30) Foreign Application Priority Data

Mar. 9, 2021 (JP) ................................. 2021-037565

(51) Int. Cl.
*C30B 29/40* (2006.01)
*C30B 25/20* (2006.01)
(Continued)

(52) U.S. Cl.
CPC ............ *C30B 29/406* (2013.01); *C30B 25/20* (2013.01); *H10D 62/40* (2025.01); *C30B 19/02* (2013.01); *H10D 62/8503* (2025.01)

(58) Field of Classification Search
CPC ....... C23C 16/34; C30B 19/02; C30B 25/186; C30B 25/20; C30B 29/406; H01L 21/2015; H10D 62/40; H10D 62/8503
See application file for complete search history.

(56) References Cited

U.S. PATENT DOCUMENTS 10,053,796 B2 * 8/2018 Yoshida ............... B28D 5/0011
2006/0270200 A1 11/2006 Shibata
(Continued)

FOREIGN PATENT DOCUMENTS

| JP | 4396816 B | 1/2010 |
| JP | 6578570 B | 9/2019 |
| WO | 2021/132491 | 7/2021 |

OTHER PUBLICATIONS

International Search Report of PCT application No. PCT/JP2022/008951 dated Apr. 26, 2022.
(Continued)

*Primary Examiner* — Lawrence D Ferguson
(74) *Attorney, Agent, or Firm* — Wenderoth, Lind & Ponack, L.L.P.

(57) ABSTRACT

A group III nitride crystal substrate has a main surface and a back surface opposite to the main surface. The average dislocation density of the main surface and the average dislocation density of the back surface are less than or equal to $6.0 \times 10^5$ cm$^{-2}$. Furthermore, the difference between the average dislocation density of the main surface and the average dislocation density of the back surface is less than or equal to $5.0 \times 10^4$ cm$^{-2}$. The warpage of the crystal axis of the main surface has a radius of curvature of more than or equal to 30 m.

13 Claims, 17 Drawing Sheets

(51) Int. Cl.
| | | |
|---|---|---|
| *H10D 62/40* | (2025.01) | |
| *C30B 19/02* | (2006.01) | |
| *H10D 62/85* | (2025.01) | |

(56) References Cited

U.S. PATENT DOCUMENTS

| | | | |
|---|---|---|---|
| 2009/0289330 | A1 | 11/2009 | Shibata |
| 2018/0038010 | A1 | 2/2018 | Mori et al. |
| 2022/0364267 | A1 | 11/2022 | Nagashima |

OTHER PUBLICATIONS

Technical Report of Sumitomo Chemical Co., Ltd., "Development of GaN Single-Crystal Substrates"_2018.
Yusuke Mori et al., "Growth of Bulk GaN Crystal by Na Flux Method", CS Mantech Conference, US, 2014, pp. 325-328, URL:<https://csmantech.org/wp-content/acfrcwduploads/field_5e8cddf5ddd10/post_2121/091.pdf>.

* cited by examiner

DISLOCATION DENSITY (cm⁻²)

GROWN FILM THICKNESS t (mm)

DISLOCATION DENSITY DIFFERENCE BETWEEN FRONT AND BACK SURFACE _400 μm THICKNESS (cm−2)

GROWN FILM THICKNESS (mm)

(a)     WAFER PROCESSING (b)

FIG. 19

Average
$1.2×10^5 cm^{-2}$ $1.8×10^5 cm^{-2}$

| (20,0) (X3) | | | |
|---|---|---|---|
| 4.8E+05 | 8.5E+04 | 2.7E+05 | 5.1E+04 |
| 7.5E+04 | 1.5E+05 | 1.6E+05 | 3.9E+05 |
| 1.3E+05 | 1.5E+05 | 5.9E+04 | 2.1E+05 |
| 3.6E+05 | 8.8E+04 | 1.5E+05 | 3.0E+04 |

$5.5×10^4 cm^{-2}$

| (0,20) (Y2) | | | |
|---|---|---|---|
| 5.9E+04 | 5.0E+04 | 4.8E+04 | 5.4E+04 |
| 3.7E+04 | 1.3E+04 | 8.6E+04 | 6.6E+04 |
| 2.9E+04 | 9.3E+04 | 6.1E+04 | 8.5E+04 |
| 3.0E+04 | 2.4E+04 | 5.0E+04 | 8.8E+04 |

$1.2×10^5 cm^{-2}$

| (0,0) (X2) | | | |
|---|---|---|---|
| 1.3E+05 | 1.9E+05 | 3.8E+04 | 1.9E+05 |
| 3.7E+05 | 9.4E+04 | 2.1E+04 | 4.0E+04 |
| 6.2E+04 | 3.0E+04 | 4.0E+04 | 3.8E+04 |
| 1.3E+05 | 2.2E+05 | 1.2E+05 | 1.9E+05 |

$1.3×10^5 cm^{-2}$

| (0,-20) (Y1) | | | |
|---|---|---|---|
| 3.5E+04 | 1.2E+05 | 9.8E+04 | 1.4E+05 |
| 7.4E+04 | 6.6E+04 | 1.2E+05 | 1.3E+05 |
| 1.2E+05 | 2.9E+05 | 3.9E+05 | 2.7E+05 |
| 5.3E+05 | 1.4E+05 | 2.7E+04 | 9.6E+03 |

$1.4×10^5 cm^{-2}$

| (-20,0) (X1) | | | |
|---|---|---|---|
| 1.5E+05 | 1.6E+05 | 2.8E+05 | 9.8E+04 |
| 1.0E+05 | 6.2E+04 | 1.2E+05 | 1.4E+05 |
| 7.2E+04 | 3.1E+05 | 1.2E+05 | 2.4E+05 |
| 6.9E+04 | 2.0E+05 | 9.3E+04 | 7.8E+04 |

Y2・ ←20mm→ X3
X1・ X2・
Y1・

DISLOCATION DENSITY (cm−2)

GROWN FILM THICKNESS (mm)

DISLOCATION DENSITY DIFFERENCE BETWEEN FRONT AND BACK SURFACE _400 μm THICKNESS (cm−2)

GROWN FILM THICKNESS (mm)

DISLOCATION DENSITY (cm−2)

GROWN FILM THICKNESS (mm)

DISLOCATION DENSITY DIFFERENCE BETWEEN FRONT AND BACK SURFACE _400 μm THICKNESS (cm−2)

GROWN FILM THICKNESS (mm)

HVPE GROWTH GaN

Na INCLUSION

LIQUID PHASE SUBSTRATE 100.0μm (TABLE 1)

| | | Growth rate (μm/h) | | | |
|---|---|---|---|---|---|
| | | 28 μm/h HCl: 0.07 slm NH3: 0.6 slm | 88 μm/h HCl: 0.13 slm NH3: 1.2 slm | 159 μm/h HCl: 0.20 slm NH3: 1.8 slm | 200 μm/h HCl: 0.26 slm NH3: 1.8 slm |
| Growth temperature (°C) | 950°C | IMPROVED | - | - | - |
| | 970°C | IMPROVED | DETERIORATED | DETERIORATED | - |
| | 1000°C | IMPROVED | IMPROVED | IMPROVED | IMPROVED |
| | 1020°C | - | - | - | IMPROVED |

GROUP III NITRIDE CRYSTAL, GROUP III NITRIDE SEMICONDUCTOR, GROUP III NITRIDE SUBSTRATE, AND METHOD FOR PRODUCING GROUP III NITRIDE CRYSTAL

TECHNICAL FIELD

The present disclosure relates to a group III nitride crystal, a group III nitride semiconductor, a group III nitride substrate, and a method for producing the group III nitride crystal.

BACKGROUND ART

Group III nitride crystals can cover a wide band gap by changing the composition of group III elements (Ga, Al, In), and thus are used for optical semiconductor devices such as light emitting diodes (LED) and laser diodes (LD). Furthermore, group III nitride crystals have a high dielectric breakdown field of 3.3 MV/cm$^{-3}$ (GaN), and are therefore widely used in electronic devices for high frequency and high power applications, for example. Optical devices and electronic devices that are produced using a group III nitride crystal and homoepitaxially grown on the substrate have high crystallinity. Thus, element characteristics of these devices are greatly improved as compared with devices formed on a heterogeneous substrate such as a sapphire substrate. Therefore, devices formed using group III nitride crystals are greatly expected and widely researched and developed.

As a group III nitride crystal used for these high-performance devices, the following method is known, the method including: growing a thick film of a group III nitride crystal on a heterogeneous seed substrate made of sapphire or the like by hydride vapor phase epitaxy (HVPE method); and slicing the thick film of the group III nitride crystal to form a free-standing nitride substrate. The HVPE method is a method of introducing a GaCl gas and an ammonia gas into a growth chamber to react these gases, thereby growing a GaN crystal. For example, PTL 1 discloses a technique in which a mask or an uneven pattern is formed on a heterogeneous seed substrate and crystals are selectively grown thereon by the HVPE method. As a result, a nitride semiconductor crystal nucleus including facets having an angle with respect to the surface of the substrate is intentionally formed, and a nitride crystal is then laterally grown on the crystal nucleus to obtain a nitride semiconductor crystal having a dislocation density of about 5.0×10$^6$ cm$^{-2}$.

However, in the technique of PTL 1, the nitride crystal has a high dislocation density of about 10$^7$ cm$^{-2}$ at the initial stage of growth as shown in FIG. 1, according to the relationship between the film thickness and the dislocation density of the nitride crystal disclosed in NPL 1. FIG. 1 is a graph showing the relationship between the film thickness and the dislocation density of a group III nitride crystal grown on a sapphire seed substrate disclosed in NPL 1. Therefore, even when crystals are grown with a film thickness of about 1 mm, the surface dislocation density is only about 5.0×10$^6$ cm$^{-2}$ at most as shown in FIG. 1.

In addition, when the dislocation density distribution in the film thickness direction is large, the curvature of the +c-axis of the nitride crystal is a radius of about 5 m, which indicates increased warpage. FIG. 2 shows a difference between the dislocation density on the front surface side and the dislocation density on the back surface side of a crystal, the crystal being prepared by slicing a nitride crystal grown on a sapphire substrate in the same manner as in FIG. 1 in a region of a specific grown film thickness from the front surface side to cut out a nitride crystal with a thickness of 500 μm on the sapphire substrate side, and processing the cut nitride crystal into a crystal with a thickness of 400 μm. In the graph of FIG. 2, a plot indicated by an arrow indicates a value of a difference in dislocation density between the front and back surfaces of a nitride crystal, the nitride crystal being prepared by slicing a nitride crystal in a region of 1.5 mm to 2 mm from the front surface side to cut out a nitride crystal with a thickness of 500 μm, and processing the cut nitride crystal into a crystal with a thickness of 400 μm. Specifically, the dislocation density on the front surface (2.0 mm) is about 1.0×10$^6$ cm$^{-2}$ and the dislocation density on the back surface (1.6 mm) is about 1.25×10$^6$ cm$^{-2}$. This indicates that the difference in dislocation density between the front and back surfaces is about 2.5×10$^5$ cm$^{-2}$. The difference in dislocation density in the film thickness direction inside the nitride crystal induces warpage of the crystal axis of the surface of the nitride crystal (part (a) in FIG. 3). Therefore, when a nitride crystal is processed so as to be flat for use as a wafer, there is a possibility that the inclination of the crystal axis of the main surface of the crystal changes in the surface of the wafer as shown part (b) in FIG. 3. Such distribution of crystal axes in the surface of the wafer is likely to cause variations in composition and film thickness in crystal growth of a nitride mixed crystal used for devices, and may lead to deterioration in quality. Therefore, it is required to achieve both further improvement in dislocation density and reduction in crystal warpage.

PTL 2 discloses a method in which a nitride crystal is grown, by the HVPE method, on a nitride seed substrate formed by liquid phase growth such as a Na flux method, and the nitride crystal is sliced and polished to obtain a high-quality nitride crystal. In addition, PTL 2 states that a nitride crystal obtained by the Na flux method has a good dislocation density of less than or equal to 6.0×10$^5$ cm$^2$, and the crystal warpage of the c-axis has a radius of curvature of more than or equal to 30 m.

However, the growth temperature used in the HVPE method is usually about 1,050° C. When a nitride crystal is grown on the liquid-phase grown seed substrate disclosed in PTL 2 at a growth temperature of 1,050° C. by the HVPE, a good nitride crystal cannot be obtained. This is considered to be an influence of Na (Na inclusion) existing inside the liquid-phase grown nitride seed substrate obtained by the Na flux method. In the Na flux method, Na existing in the melt is incorporated into the seed substrate to form Na inclusion. As shown in the optical micrographs of the nitride crystal formed by liquid phase growth in part (a) in FIG. 4 and part (b) in FIG. 4, the Na inclusion is observed as a white cavity inside the crystal, and exists in a streak shape shown in part (a) in FIG. 4 or a circular shape shown in part (b) in FIG. 4. Under a high temperature of 1,030° C. to 1,050° C. used in the HVPE method, it is considered that this Na inclusion expands inside the seed substrate and ruptures as shown in FIG. 5. The rupture creates a large indentation in the seed substrate as shown in FIG. 6. Further, not only the ruptured Na inclusion contaminates the surface of the seed substrate with Na, but also the nitride crystal itself in the seed substrate, the nitride crystal being scattered by the rupture, remains as a foreign substance on the surface of the seed substrate. For this reason, the ruptured Na inclusion inhibits the growth of the nitride crystal on the seed substrate in the HVPE method. It is therefore considered that the crystallinity of the nitride crystal on the seed substrate grown by the HVPE method is deteriorated, and a good nitride crystal cannot be obtained.

CITATION LIST

Patent Literature

PTL 1: Japanese Patent No. 4396816
PTL 2: Japanese Patent No. 6578570

Non-Patent Literature

NPL 1: Technical Report of Sumitomo Chemical Co., Ltd., "Development of GaN Single Crystal Substrate" _2018

SUMMARY OF THE INVENTION

A group III nitride crystal according to an aspect of the present disclosure includes a main surface; and a back surface opposite to the main surface, wherein the main surface has an average dislocation density of less than or equal to $6.0 \times 10^5$ cm$^{-2}$, and the back surface has an average dislocation density of less than or equal to $6.0 \times 10^5$ cm$^{-2}$; a difference between the average dislocation density of the main surface and the average dislocation density of the back surface is less than or equal to $5.0 \times 10^4$ cm$^{-2}$; and a warpage of a crystal axis of the main surface has a radius of curvature of more than or equal to 30 m.

A method for producing a group III nitride crystal according to the present disclosure includes: a preparation step of preparing a group III nitride seed substrate containing Na; and a growth step of growing a group III nitride crystal on the group III nitride seed substrate by vapor phase growth, wherein a start temperature of the growth step is 950° C. or higher and 970° C. or lower; and growth of the group III nitride crystal in the growth step is performed at a temperature of 950° C. or higher and 1,020° C. or lower.

Advantageous Effect of Invention

According to a group III nitride crystal according to the present disclosure, it is possible to provide a high-quality group III nitride crystal.

BRIEF DESCRIPTION OF THE DRAWINGS

FIG. 19 is a table showing the in-plane distribution of the surface dislocation density of the group III nitride crystal in Example.

DESCRIPTION OF EMBODIMENT

Figure 1:
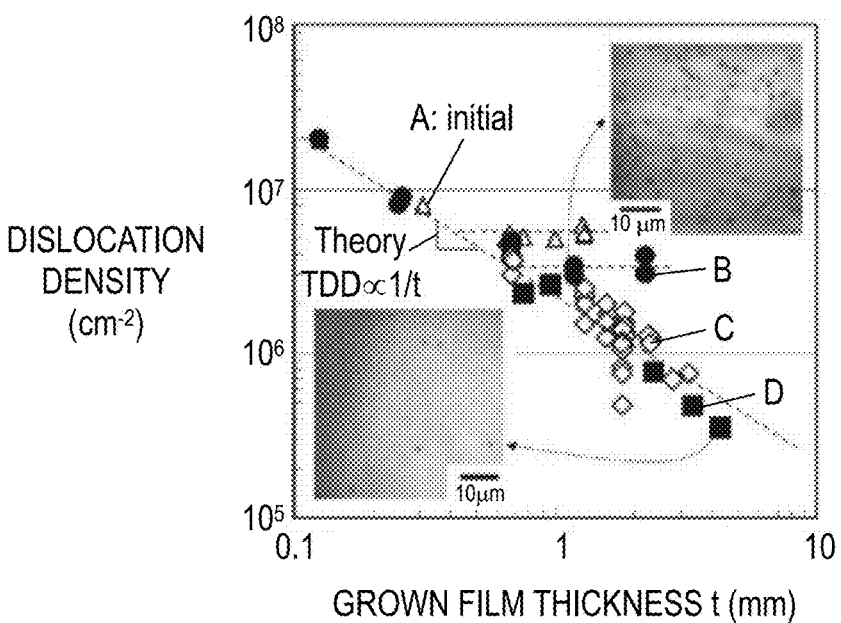
FIG. 1 is a graph showing a relationship between the film thickness and the dislocation density of a group III nitride crystal grown on a sapphire seed substrate in the conventional art.
Figure 2:
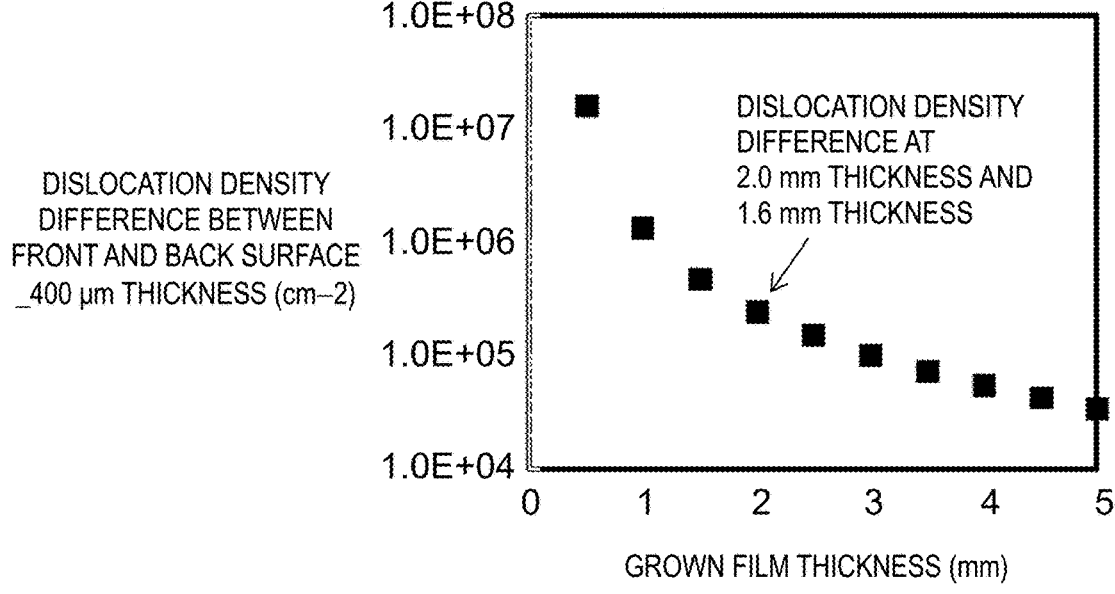
FIG. 2 is a graph showing a relationship between the film thickness of a group III nitride crystal grown on a sapphire seed substrate in the conventional art and a difference in dislocation density between the front and back surfaces of a group III nitride crystal obtained by cutting out a nitride crystal from the grown nitride crystal in a region of each film thickness and shaping the cut-out nitride crystal into a thickness of 400 μm.
Figure 3:
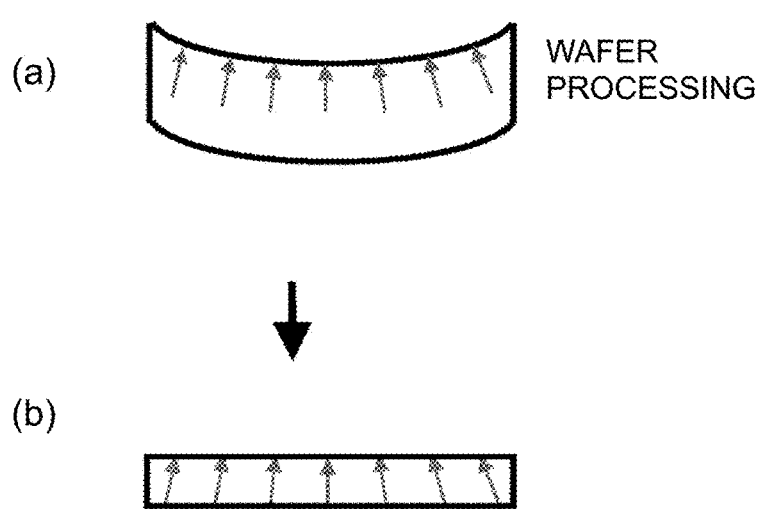
FIG. 3 is a conceptual view showing crystal warpage of a group III nitride crystal, the crystal warpage occurring in the conventional art.
Figure 4:
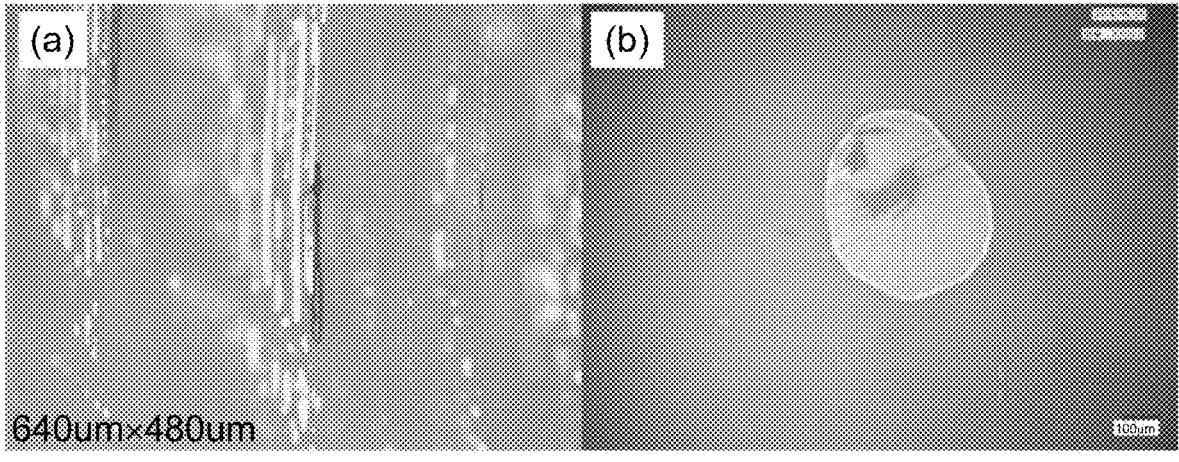
FIG. 4 is an optical micrograph of Na inclusion in a group III nitride crystal, the Na inclusion being generated in the conventional art.
Figure 5:
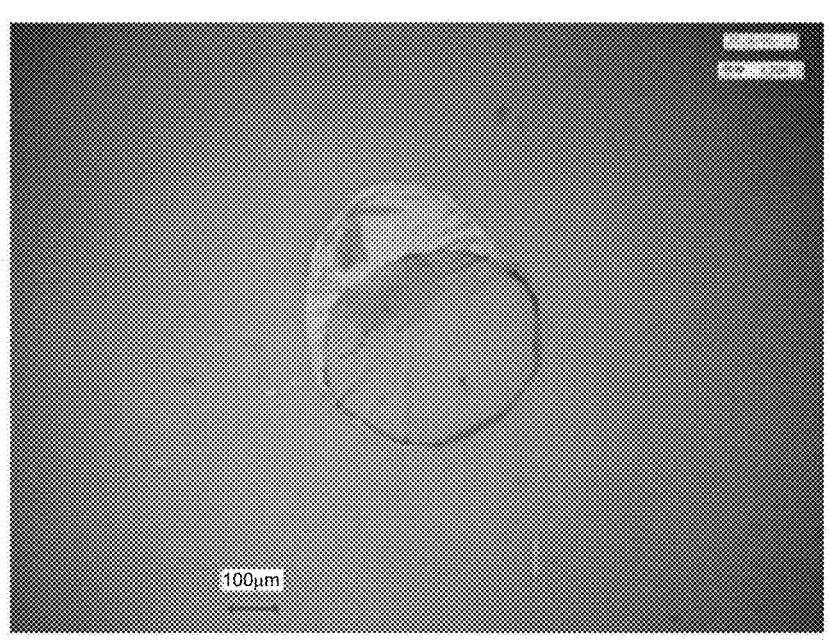
FIG. 5 is an optical micrograph of ruptured Na inclusion in a group III nitride crystal, the ruptured Na inclusion being generated in the conventional art.
Figure 6:
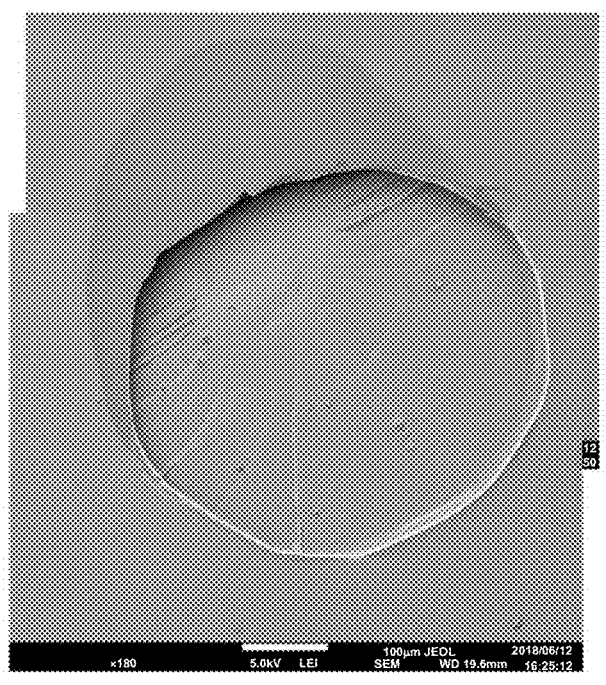
FIG. 6 is an electron micrograph of ruptured Na inclusion in a group III nitride crystal, the ruptured Na inclusion being generated in the conventional art.

An object of the present disclosure is to provide a high-quality group III nitride crystal, a group III nitride semiconductor and a group III nitride substrate including the same, and a method for producing the group III nitride crystal.

A group III nitride crystal according to a first aspect includes a main surface; and a back surface opposite to the main surface, wherein the main surface has an average dislocation density of less than or equal to $6.0 \times 10^5$ cm$^{-2}$, and the back surface has an average dislocation density of less than or equal to $6.0 \times 10^5$ cm$^{-2}$; a difference between the average dislocation density of the main surface and the average dislocation density of the back surface is less than or equal to $5.0 \times 10^4$ cm$^{-2}$; and a warpage of a crystal axis of the main surface has a radius of curvature of more than or equal to 30 m.

According to a group III nitride crystal of a second aspect, in the first aspect, the main surface has an average dislocation density of less than or equal to $2.0 \times 10^5$ cm$^{-2}$ and the back surface has an average dislocation density of less than or equal to $2.0 \times 10^5$ cm$^{-2}$; and a difference between the average dislocation density of the main surface and the average dislocation density of the back surface may be less than or equal to $2.0 \times 10^4$ cm$^{-2}$.

According to a group III nitride crystal of a third aspect, in the first or second aspect, the group III nitride crystal may have a thickness of 0.3 mm or more and 1.0 mm or less.

A group III nitride semiconductor according to a fourth aspect includes: the group III nitride crystal according to any one of the first to third aspects; and a group III nitride semiconductor element stacked on the group III nitride crystal.

A group III nitride substrate according to a fifth aspect includes: a group III nitride seed substrate containing Na; and the group III nitride crystal according to any one of the first to third aspects, the group III nitride crystal being stacked on the group III nitride seed substrate.

According to a group III nitride substrate of a sixth aspect, in the fifth aspect, the group III nitride crystal may have a film thickness of more than or equal to 0.5 mm.

A method for producing a group III nitride crystal according to a seventh aspect includes: a preparation step of preparing a group III nitride seed substrate containing Na; and a growth step of growing a group III nitride crystal on the group III nitride seed substrate by vapor phase growth, wherein a start temperature of the growth step is 950° C. or higher and 970° C. or lower; and growth of the group III nitride crystal in the growth step is performed at a temperature of 950° C. or higher and 1,020° C. or lower.

A method for producing a group III nitride crystal according to an eighth aspect may further include, in the seventh aspect, a surface treatment step of surface-treating the group III nitride seed substrate containing Na at a temperature of 720° C. or higher and 900° C. or lower.

According to a method for producing a group III nitride crystal of a ninth aspect, in the eighth aspect, the surface treatment step may be performed at 720° C. or higher and 750° C. or lower.

According to a method for producing a group III nitride crystal of a tenth aspect, in any one of the seventh to ninth aspects, growth of the group III nitride crystal in the growth step may be performed at a growth rate of more than or equal to 100 μm/h by controlling a supply amount of a source gas and a temperature of the group III nitride crystal.

According to a method for producing a group III nitride crystal of an eleventh aspect, in any one of the seventh to tenth aspects, the growth step may be performed until the film thickness of the group III nitride crystal reaches more than or equal to 0.5 mm.

A method for producing a group III nitride crystal according to a twelfth aspect may further include, in any one of the seventh to eleventh aspects, a processing step of slicing and polishing the group III nitride crystal grown on the group III nitride seed substrate.

Hereinafter, a group III nitride crystal, a method for producing the group III nitride crystal, and a group III nitride substrate according to an exemplary embodiment will be described with reference to the accompanying drawings. Note that, in the drawings, substantially the same members are designated by the same reference marks.

First Exemplary Embodiment

A method for producing a group III nitride crystal according to the first exemplary embodiment will be described in detail with reference to FIGS. 8 and 9.

<Group III Nitride Seed Substrate>

In the first exemplary embodiment, a GaN crystal seed substrate produced by the Na flux method is used as group III nitride seed substrate 101. The GaN crystal seed substrate can be formed by shaping and polishing a GaN ingot produced by the Na flux method, and subjecting the surface of the resulting product to a chemical mechanical polishing treatment (CMP treatment). The film thickness of the GaN crystal seed substrate used in the exemplary embodiment is 400 μm, but is not limited thereto, and may be, for example, 300 μm or more and 2,000 μm or less.

<Group III Nitride Crystal Production Apparatus>

Figures 8, 9:
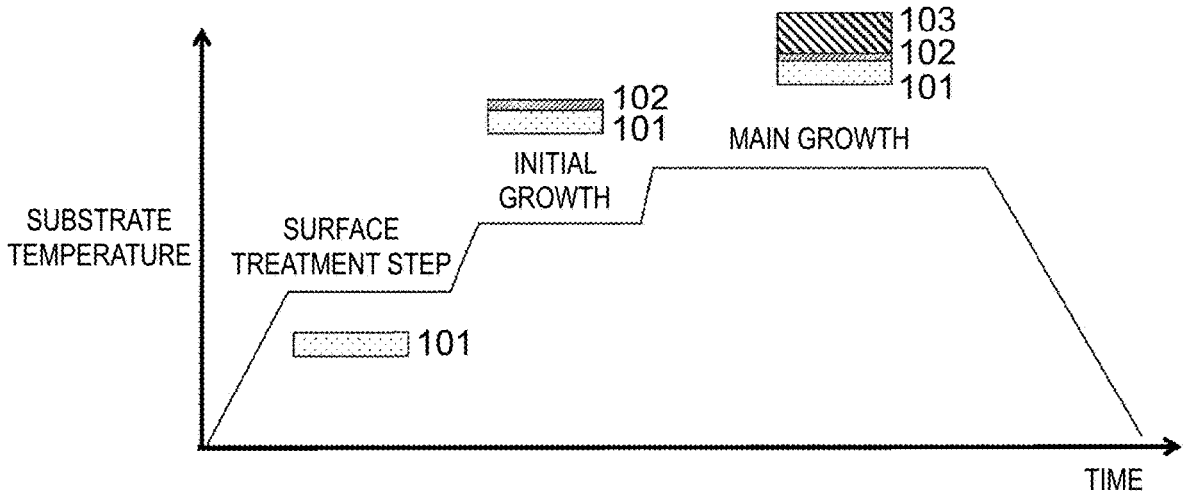
FIG. 8 is a schematic view of a group III nitride crystal production apparatus according to a first exemplary embodiment.
FIG. 9 is a graph showing a growth sequence of the group III nitride crystal according to the first exemplary embodiment.

FIG. 8 is a schematic view of group III nitride crystal production apparatus 100 used in the method for producing a group III nitride crystal according to the first exemplary embodiment. Group III nitride crystal production apparatus 100 includes: reaction chamber 110 in which group III nitride seed substrate 101 for growing a group III nitride crystal is disposed; first nozzle 111 for introducing a group III reaction gas into reaction chamber 110; second nozzle 112 for introducing a group V reaction gas into reaction chamber 110; and third nozzle 113 for introducing a carrier gas into reaction chamber 110. The group III reaction gas is generated by introducing a chloride gas from chloride gas introduction nozzle 115 into group III raw material chamber 114 in which group III metal is disposed. The group III reaction gas is supplied from first nozzle 111 to group III nitride seed substrate 101. Substrate 101 disposed in reaction chamber 110 is held by susceptor 116. The size of susceptor 116 is larger than the size of group III nitride seed substrate 101. Susceptor 116 may further have a heating mechanism, a rotation mechanism, and the like. The gas introduced into reaction chamber 110 is exhausted from exhaust unit 117.

<Method for Producing Group III Nitride Crystal>

FIG. 9 shows a growth sequence of the group III nitride crystal according to the first exemplary embodiment. As shown in FIG. 9, the method for producing a group III nitride crystal includes: a surface treatment step; and a growth step including an initial growth step and a main growth step.

(Surface Treatment Step)

In the heat treatment step, oxide such as an oxide film and dirt such as carbon on the surface of group III nitride seed substrate 101 are removed to make a clean crystal surface. However, it is necessary to suppress the rupture of Na inclusion in group III nitride seed substrate 101. In the first exemplary embodiment, by performing a surface treatment at 720° C. or higher and 900° C. or lower, it possible to suppress the rupture of Na inclusion and to sufficiently improve the state of the surface of group III nitride seed substrate 101. When the temperature of the surface treatment is lower than 720° C., the etching effect by $H_2$ and the decomposition of $NH_3$ are not sufficient. Thus, the surface of group III nitride seed substrate 101 cannot be sufficiently cleaned. When the temperature of the surface treatment is higher than 900° C., the temperature exceeds the growth temperature of group III nitride seed substrate 101, so that the rupture of Na inclusion cannot be sufficiently suppressed. Therefore, the surface treatment step is more preferably performed at a temperature of 720° C. or higher and 800° C. or lower, and most preferably performed at a temperature of 720° C. or higher and 750° C. or lower.

(Initial Growth Step)

The initial growth step is necessary for growing, on group III nitride seed substrate 101, a high-quality group III nitride crystal that takes over the crystallinity of group III nitride seed substrate 101 having high crystallinity. The initial growth step is a step of vapor-phase growing a group III nitride crystal on group III nitride seed substrate 101. The initial growth step is performed at a temperature of 950° C. or higher and 970° C. or lower. That is, the start temperature of the growth step is set to 950° C. or higher and 970° C. or lower. In the initial growth step, the group III nitride crystal has not yet grown on the surface of group III nitride seed substrate 101, and the surface of group III nitride seed substrate 101 is exposed. Therefore, when the temperature is higher than 970° C., there is a possibility that Na inclusion in the surface of group III nitride seed substrate 101 ruptures. On the other hand, at a temperature lower than 950° C., the growth of the group III nitride crystal on group III nitride seed substrate 101 cannot be started. When the initial growth step is performed at a temperature of 950° C. or higher and 970° C. or lower, it is possible to prevent rupture of Na inclusion and to start the growth of the group III nitride crystal. The initial growth step is preferably performed until the film thickness of the group III nitride crystal grown on group III nitride seed substrate 101 reaches more than or equal to 30 μm, and more preferably more than or equal to 100 μm. Initial growth crystal 102 of a group III nitride crystal is formed on group III nitride seed substrate 101 through the initial growth step. Formation of initial growth crystal 102 fills Na inclusion exposed on the surface, and suppresses the rupture of Na inclusion even when the growth temperature is increased to some extent in the subsequent main growth.

(Main Growth Step)

The main growth step is performed at a temperature of 950° C. or higher and 1,020° C. or lower. When the group III nitride crystal grown on group III nitride seed substrate 101 is cut out to form a wafer, main growth is desirably performed so that the grown film thickness reaches more than or equal to 0.5 mm. A desired grown film thickness can be obtained by extending the growth time in the main growth step. For example, the growth of a group III nitride crystal having a film thickness of about 10 mm can also be obtained. In order to achieve growth of a thick film of more than or equal to 0.5 mm, main growth is preferably performed at a growth rate of more than or equal to 100 μm/h, more preferably more than or equal to 150 μm/h, from the viewpoint of crystal growth efficiency.

The growth rate can be set by controlling the supply amount of the source gas and the growth temperature (the temperature of the group III nitride crystal). In particular, the growth rate is substantially determined by the supply amount of the source gas. For example, in the case of the supply amount of 0.07 slm of HCl gas and 0.6 slm of $NH_3$ gas, the growth rate is 28 μm/h. In the case of the supply amount of 0.13 slm of HCl gas and 1.2 slm of $NH_3$ gas, the growth rate is 88 μm/h. In the case of the supply amount of 0.20 slm of HCl gas and 1.8 slm of $NH_3$ gas, the growth rate is 159 μm/h. In addition, in the case of the supply amount of 0.26 slm of HCl gas and 1.8 slm of $NH_3$ gas, the growth rate is 200 μm/h.

In the main growth step, doping may be performed as necessary with an n-type dopant such as Si, an n-type dopant such as O or Ge, or a p-type dopant such as Mg.

Through the main growth step, main growth crystal 103 of a group III nitride crystal is further formed on initial growth crystal 102. As a result, a group III nitride substrate with a group III nitride crystal grown on group III nitride seed substrate 101 can be obtained.

<Group III Nitride Substrate>

In the group III nitride substrate according to the first exemplary embodiment, the grown group III nitride crystal takes over the characteristics of group III nitride seed substrate 101. Therefore, by using high-quality group III nitride seed substrate 101 in which rupture of Na inclusion is suppressed, the quality of the group III nitride crystal can be improved. In the group III nitride crystal on group III nitride seed substrate 101 according to the first exemplary embodiment, the average dislocation densities of the main surface and the back surface are less than or equal to $6.0 \times 10^5$ $cm^{-2}$, a difference in average dislocation density between the main surface and the back surface is less than or equal to $5.0 \times 10^4$ $cm^{-2}$, and the radius of curvature is more than or equal to 30 μm, which is high quality. In addition, it is possible to obtain such a high-quality group III nitride crystal having a thick film of more than or equal to 0.5 mm even in a size of more than or equal to 2 inches in diameter. In addition, it is also possible to achieve a higher quality in which the average dislocation densities of the main surface and the back surface of the group III nitride crystal on group III nitride seed substrate 101 are less than or equal to $3.0 \times 10^5$ $cm^{-2}$.

(Processing Step)

In the first exemplary embodiment, the method for producing a group III nitride crystal may further include a processing step of slicing and polishing the group III nitride crystal grown on group III nitride seed substrate 101. The group III nitride crystal can be cut out from the group III nitride substrate by a grinder, a wire saw, or the like. Then, if necessary, the surface of the cut-out group III nitride crystal is subjected to an orientation flat process, a mirror polishing process, a chemical mechanical polishing treatment, or the like, whereby a group III nitride crystal can be obtained.

<Group III Nitride Crystal>

In a wafer of the group III nitride crystal thus obtained, the dislocation densities of the main surface and the back surface are less than or equal to $6.0\times10^5$ cm$^{-2}$, a difference in average dislocation density between the main surface and the back surface is less than or equal to $5.0\times10^4$ cm$^{-2}$, and the radius of curvature is more than or equal to 30 m, which is high quality. In addition, even in the case of a size of more than or equal to 2 inches in diameter, it is possible to produce such a high-quality wafer of a group III nitride crystal having a thick film of 0.3 mm or more and 1.0 mm or less. It is also possible to realize a higher-quality group III nitride crystal in which the dislocation densities of the main surface and the back surface of the group III nitride crystal are less than or equal to $2.0\times10^5$ cm$^{-2}$, and the difference in average dislocation density between the main surface and the back surface is less than or equal to $2.0\times10^4$ cm$^{-2}$.

<Group III Nitride Semiconductor>

A group III nitride semiconductor can be produced by stacking a group III nitride semiconductor element on the wafer of the group III nitride crystal obtained above.

EXAMPLE

A GaN crystal seed substrate was produced using a template substrate in which a GaN thin film has been grown on a sapphire substrate by the Na flux method.

(1) Na and Ga were introduced into a crucible in a liquid phase apparatus at a molar ratio of about 50:50, and the temperature of the crucible was set to 800° C. or higher and 1,000° C. or lower.

(2) Next, nitrogen gas was fed into the liquid phase apparatus, and the gas pressure in the liquid phase apparatus was set to $1\times10^6$ Pa or more and $1\times10^7$ Pa or less. Nitrogen was dissolved in Na melted at a high temperature, and a GaN crystal was grown on the template substrate immersed in the melt. The liquid-phase grown GaN crystal seed substrate (may be referred to as a liquid phase substrate or a liquid phase seed substrate) had a regular hexagonal shape, and the inscribed circle of the hexagonal shape was (D 60 mm. The obtained liquid-phase grown GaN crystal seed substrate was used as group III nitride seed substrate 101.

Figure 7B:
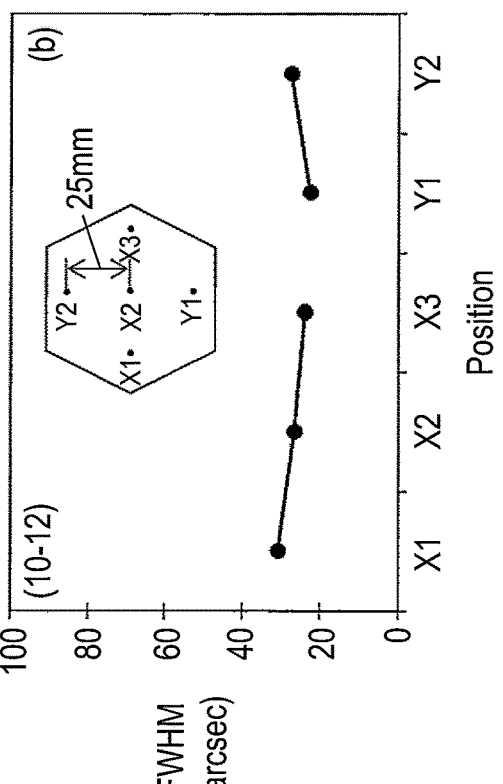
FIG. 7B is a graph showing an in-plane distribution of full width at half maximum of an X-ray ω-SCAN rocking curve of the group III nitride seed substrate in Example.
Figure 7A:
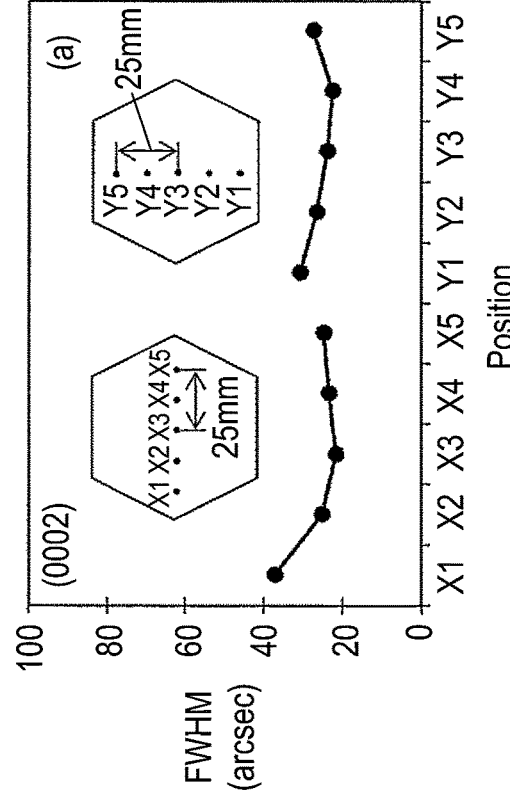
FIG. 7A is a graph showing an in-plane distribution of full width at half maximum of an X-ray ω-SCAN rocking curve of a group III nitride seed substrate in Example.

FIG. 7A shows the result of the full width at half maximum of an X-ray ω-SCAN rocking curve of the (0002) plane in the surface of the liquid-phase grown GaN crystal seed substrate. The full width at half maximum at five points in the surface was 27.4 arcsec in the (0002) plane. FIG. 7B shows the result of the full width at half maximum of an X-ray ω-SCAN rocking curve of the (10-12) plane in the surface of the liquid-phase grown GaN crystal seed substrate of the first exemplary embodiment. The full width at half maximum at five points in the surface was 23.6 arcsec in the (10-12) plane. As shown in FIGS. 7A and 7B, the liquid-phase grown GaN crystal seed substrate has uniform and favorable crystallinity in the surface. In addition, the radius of curvature of the c-plane estimated from the peak angle of the (0002) plane in the surface was about 60 m and flat. In the liquid-phase grown GaN crystal seed substrate used in Example, the full width at half maximum of the X-ray ω-SCAN rocking curve was less than or equal to 32 arcsec in the (0002) plane, less than or equal to 33 arcsec in the (10-12) plane, and the radius of curvature was about more than or equal to 30 m.

(3) Next, the obtained liquid-phase grown GaN crystal seed substrate was heat-treated at 720° C. Specifically, the liquid-phase grown GaN crystal seed substrate was disposed in reaction chamber 110 of the group III nitride crystal production apparatus, and the temperature was raised to 720° C. at a temperature rise rate of 20° C./min under a N$_2$ atmosphere. Thereafter, NH$_3$ at a flow rate of 3.5 slm was introduced into reaction chamber 110 from second nozzle 112, and N$_2$ at a flow rate of 4.0 slm and H$_2$ at a flow rate of 16.0 slm were introduced into reaction chamber 110 from third nozzle 113 while the temperature of the liquid-phase grown GaN crystal seed substrate was maintained, and heat treatment was performed for 60 minutes. The rotation speed of susceptor 116 was set to 500 rpm.

Figure 10:
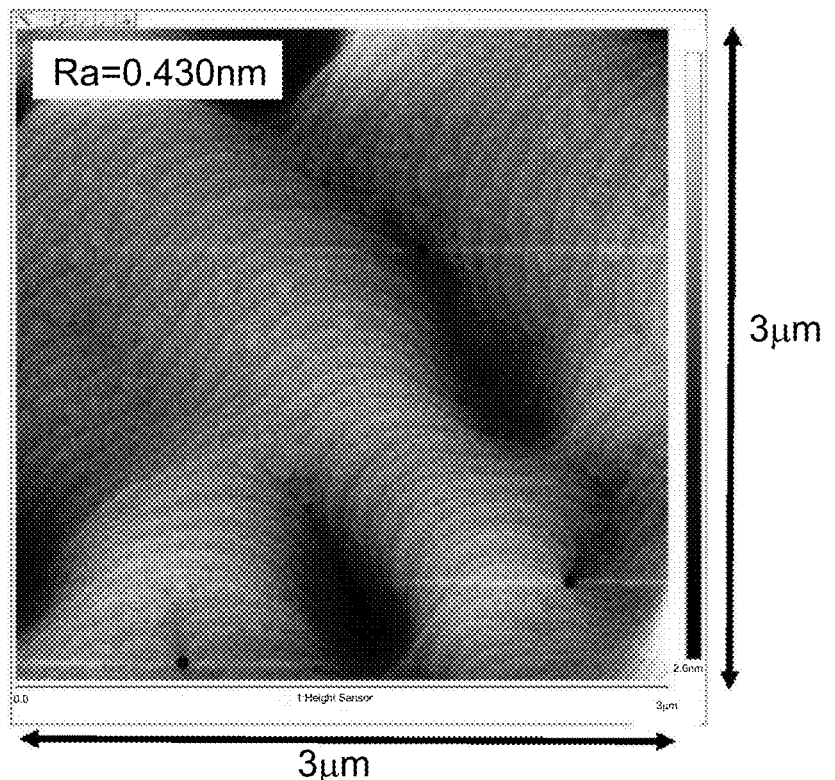
FIG. 10 is an atomic force microscope image of a surface of a group III nitride seed substrate after a surface treatment step in Example.

FIG. 10 shows the result of atomic force microscope evaluation in a region of 3 μm×3 μm of the surface of the liquid-phase grown GaN crystal seed substrate after the heat treatment. FIG. 10 shows that good atomic steps are observed on the surface and the surface is cleaned well. The roughness value Ra estimated from the surface was 0.43 nm. Na inclusion was also observed with an optical microscope, but no rupture was observed.

(4) Next, initial growth was performed at a growth temperature of 950° C. After the heat treatment at 720° C., the temperature of the liquid-phase grown GaN crystal seed substrate was raised to 950° C. at 10° C./min under the conditions of NH$_3$ at a flow rate of 5.0 slm, N$_2$ at a flow rate of 45.0 slm, and H$_2$ at a flow rate of 3.0 slm while the rotation speed was maintained at 500 rpm. After the temperature reached 950° C., HCl gas at a flow rate of 0.07 slm was supplied from chloride gas introduction nozzle 115, NH$_3$ gas at a flow rate of 0.6 slm was supplied from second nozzle 112, and N$_2$ gas at a flow rate of 44.0 slm and H$_2$ gas at a flow rate of 12.0 slm were supplied from third nozzle 113 to reaction chamber 110. The HCl gas supplied from chloride gas introduction nozzle 115 becomes a GaCl gas in group III raw material chamber 114 in which Ga metal is disposed. The GaCl gas is supplied from first nozzle 111 to reaction chamber 110. The growth rate of GaN as a group III nitride crystal on the liquid-phase grown GaN crystal seed substrate was 28 μm/h.

Figure 11:
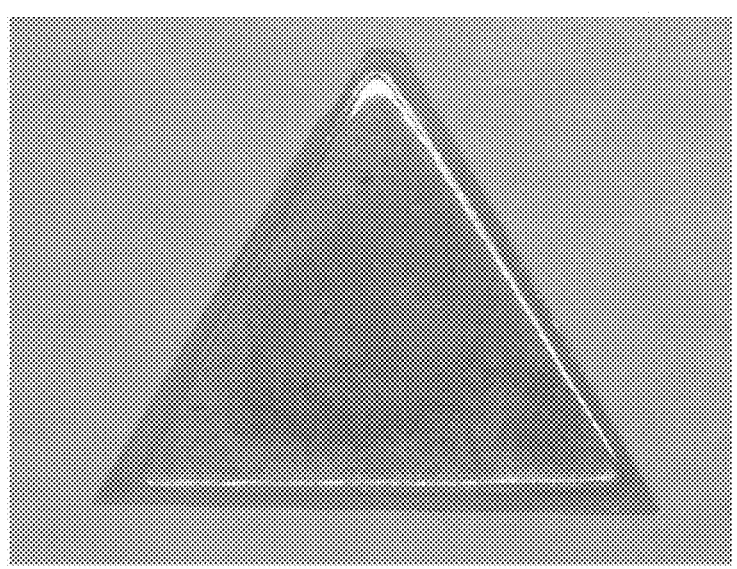
FIG. 11 is a photograph of a group III nitride crystal after an initial growth step in Example.

FIG. 11 shows a photograph of a state where a GaN crystal with a thickness of 110 μm has been grown on a triangular liquid-phase grown GaN crystal seed substrate. FIG. 11 shows that a flat GaN crystal without surface roughness is grown, and the influence of Na inclusion can be suppressed.

Figure 12A:
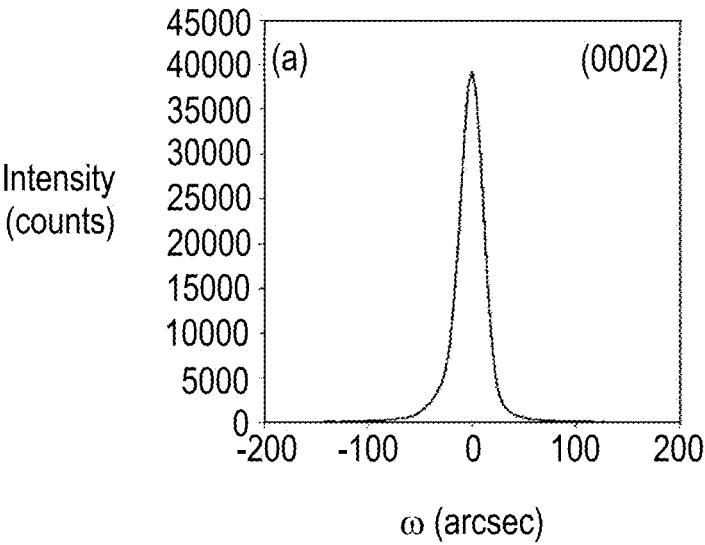
FIG. 12A is an X-ray ω-SCAN rocking curve after the initial growth step at 950° C. in Example.
Figure 12B:
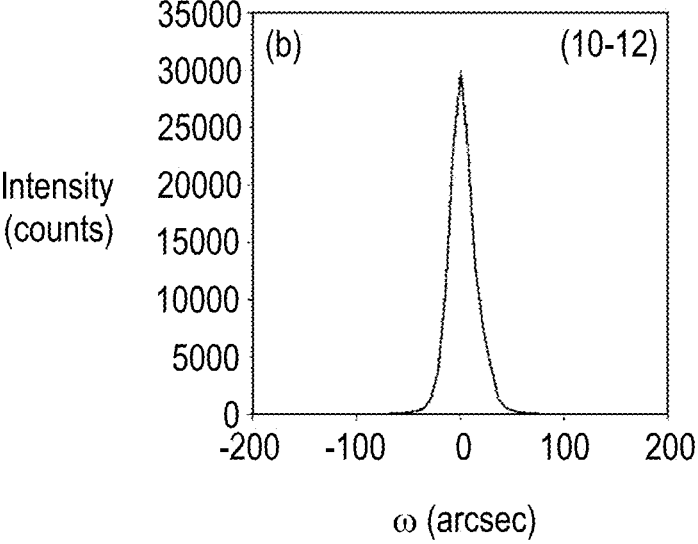
FIG. 12B is an X-ray ω-SCAN rocking curve after the initial growth step at 950° C. in Example.

FIGS. 12A and 12B show the results of the X-ray ω-SCAN rocking curve of the GaN crystal obtained in FIG. 11. The estimated full width at half maximum was 26.6 arcsec for the (0002) plane in FIG. 12A and 24.6 arcsec for the (10-12) plane in FIG. 12B. Both of the values were almost equal to the values of the liquid-phase grown GaN crystal seed substrates shown in FIGS. 7A and 7B, and the takeover of good crystallinity was confirmed. In addition, the radius of curvature of crystal warpage estimated from the diffraction angle of the peak of the (0002) plane in the surface was 148 m, which was almost flat.

Figure 13A:
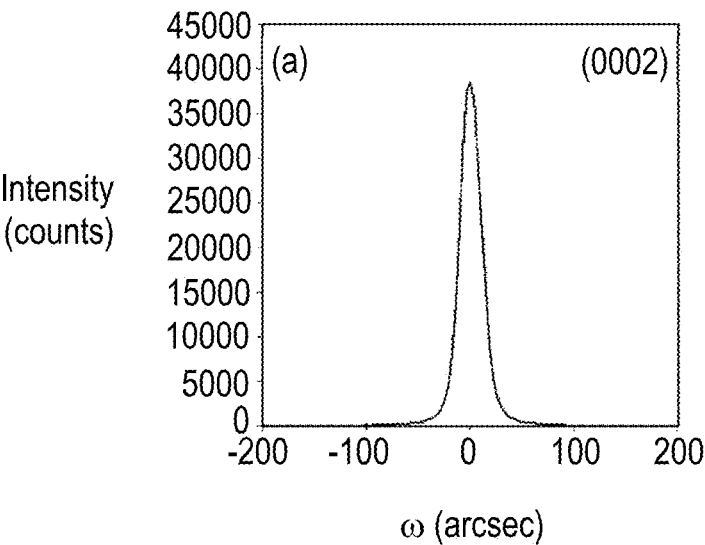
FIG. 13A is an X-ray ω-SCAN rocking curve after the initial growth step at 970° C. in Example.
Figure 13B:
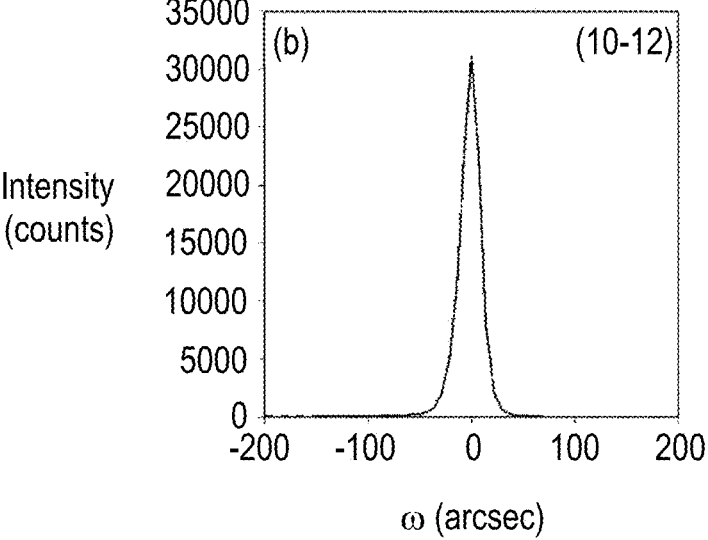
FIG. 13B is an X-ray ω-SCAN rocking curve after the initial growth step at 970° C. in Example.

FIGS. 13A and 13B show the results of the X-ray ω-SCAN rocking curve when only the initial growth temperature was changed to 970° C. under the same conditions. Even in this case, the full width at half maximum of 24.6 arcsec in the (0002) plane in FIG. 13A and 22.3 arcsec in the (10-12) plane in FIG. 13B, and the radius of curvature of 67 m, which indicate good crystallinity, could be obtained.

(5) Main growth was performed by raising the temperature of the substrate after the initial growth at 950° C., to 1,020° C. only at 10° C./min while the conditions of the initial growth were maintained. After the temperature rise, a high growth rate was realized by changing the supply gas flow rate to 0.26 slm of HCl gas, 1.8 slm of $NH_3$ gas, 44.0 slm of $N_2$ carrier gas, and 10.5 slm of $H_2$ carrier gas. In order to perform doping with Si, a $SiH_2Cl_2$ gas was supplied at 90 sccm from chloride gas introduction nozzle 115. The growth rate was 200 μm/h, and the rotation speed was 500 rpm. The growth time was 5 hours, and the grown film thickness was 1.1 mm. The Si concentration in the grown GaN crystal was $5×10^{17}$ $cm^3$.

Figure 14:
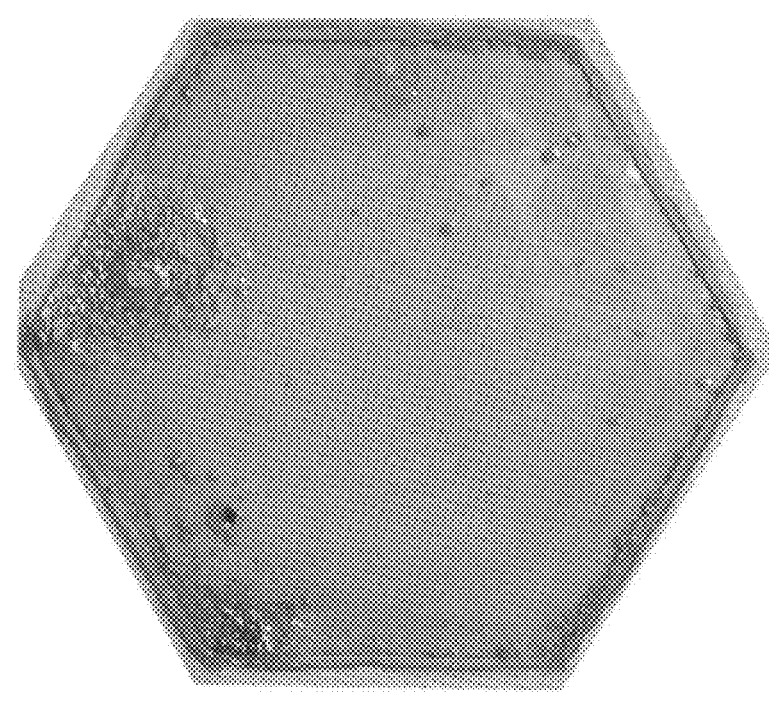
FIG. 14 is a photograph of a group III nitride crystal having a thickness of 1.1 mm in Example.
Figure 15A:
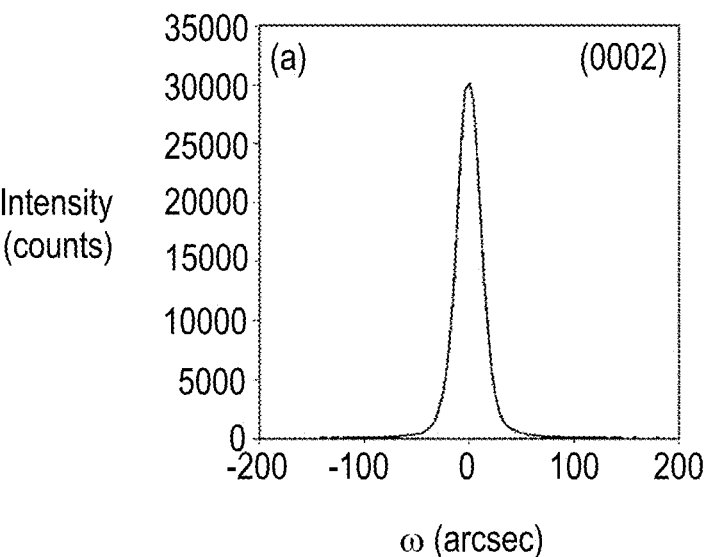
FIG. 15A is an X-ray ω-SCAN rocking curve of the group III nitride crystal having a thickness of 1.1 mm in Example.
Figure 15B:
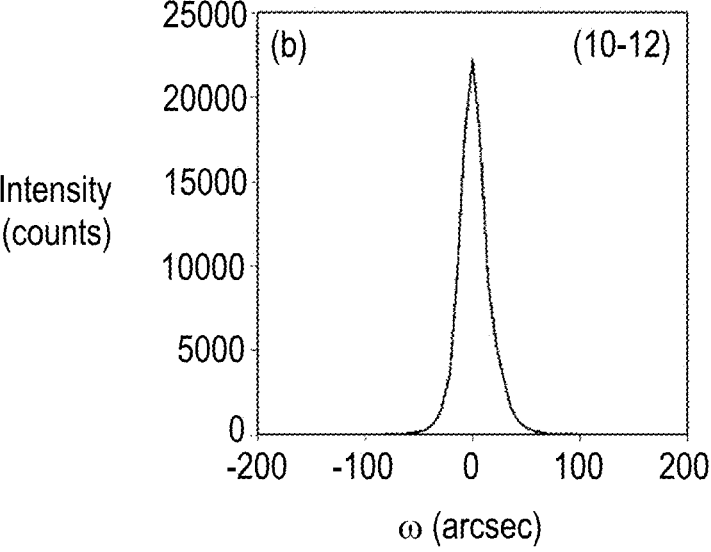
FIG. 15B is an X-ray ω-SCAN rocking curve of the group III nitride crystal having a thickness of 1.1 mm in Example.
Figures 25, 26:
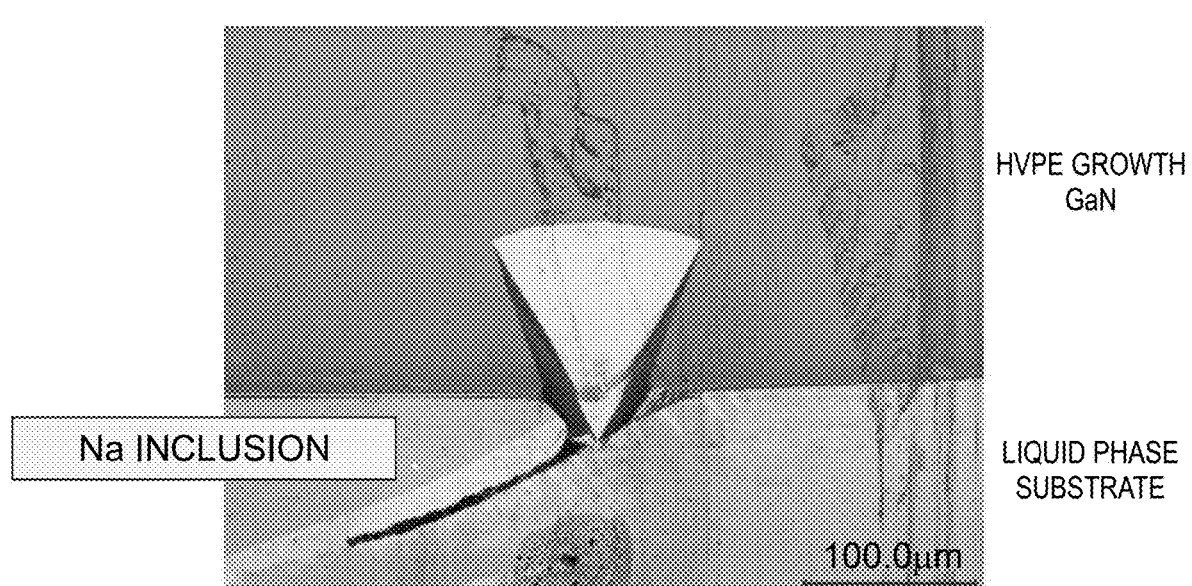
FIG. 25 is a cross-sectional SEM photograph of a group III nitride crystal grown on a group III nitride seed substrate of Comparative Example.
FIG. 26 is Table 1 showing a summary of results of examining crystallinity of the GaN grown film with respect to the growth rate and the growth temperature in the main growth.

FIG. 14 shows a photograph of a GaN crystal after the growth on a liquid-phase grown GaN crystal seed substrate. In FIG. 14, there is no significant surface roughness considered to be an influence of Na inclusion, and the GaN crystal was satisfactorily grown. In the result of the X-ray ω-SCAN rocking curve of this substrate, the full width at half maximum was 26.5 arcsec in the (0002) plane as shown in FIG. 15A, 25.9 arcsec in the (10-12) plane as shown in FIG. 15B, and the radius of curvature was 60 m, which show good crystallinity. These results show that the quality of the liquid-phase grown GaN crystal seed substrate was taken over in the initial growth and the main growth. The results also indicate that there is almost no difference in crystallinity in the film thickness direction.

Table 1 in FIG. 26 shows a summary of the results of examining the crystallinity of the GaN grown film with respect to the growth rate and the growth temperature in the main growth. The main growth conditions were examined after the liquid-phase grown GaN crystal seed substrate was heat-treated at 740° C. and then subjected to initial growth at 950° C. to a thickness of 110 μm. The term "improved" in Table 1 indicates that the change in the full width at half maximum of the X-ray ω-SCAN rocking curve after the growth is improved or suppressed within +1.0 arcsec with respect to the liquid-phase grown GaN crystal seed crystal. The term "deteriorated" indicates a case where the crystallinity of the liquid-phase grown GaN crystal seed crystal cannot be taken over, and the crystallinity is deteriorated. In addition, "-" represents a condition that is not implemented. From Table 1, under the main growth conditions, the temperature may be 950° C. or higher and 1,020° C. or lower in the case of the growth rate of 28 μm/h. Table 1 shows that the temperature is preferably 1,000° C. or higher and 1,020° C. or lower at a growth rate of 88 μm/h or more and 200 μm/h or less, and the temperature is preferably 1,000° C. or higher and 1,020° C. or lower in order to achieve a growth rate of more than or equal to 200 μm/h. Under conditions in the upper right part of Table 1, the crystallinity of the liquid-phase grown GaN crystal seed crystal cannot be taken over after the growth, and the crystallinity is likely to deteriorate. On the other hand, under the conditions in the lower left part of Table 1, the crystallinity of the liquid-phase grown GaN crystal seed crystal can be taken over after the growth, or the crystallinity can be further improved.

The crystallinity of the group III nitride crystal greatly depends on the crystallinity of the liquid-phase grown GaN seed substrate as a seed substrate. Even in a GaN seed substrate having low crystallinity among liquid-phase grown GaN seed crystals of this Example, the full width at half maximum of the X-ray ω-SCAN rocking curve was less than or equal to 32 arcsec in the (0002) plane, less than or equal to 33 arcsec in the (10-12) plane, and the radius of curvature was about 30 m. The estimated surface dislocation density was $6.0×10^5$ $cm^{-2}$, which was a value smaller by one digit than the value of the conventional GaN substrate.

(6) Next, a thick film GaN crystal on the liquid-phase grown GaN crystal seed substrate produced in this Example was sliced to cut out a 2-inch GaN crystal. In the processing, a hexagonal GaN crystal was processed into a circle with a diameter of about 52 mm by a grinder. Then, the processed GaN crystal was sliced with a wire saw to produce a plurality of HVPE grown GaN free-standing wafers having a thickness of 650 μm. Further, orientation flat processing and mirror polishing processing of the front and back surfaces were performed. The surface was finally subjected to chemical mechanical polishing treatment (CMP treatment) to produce a GaN free-standing substrate having a thickness of 400 μm and a size of 2 inches in diameter.

Figure 16:
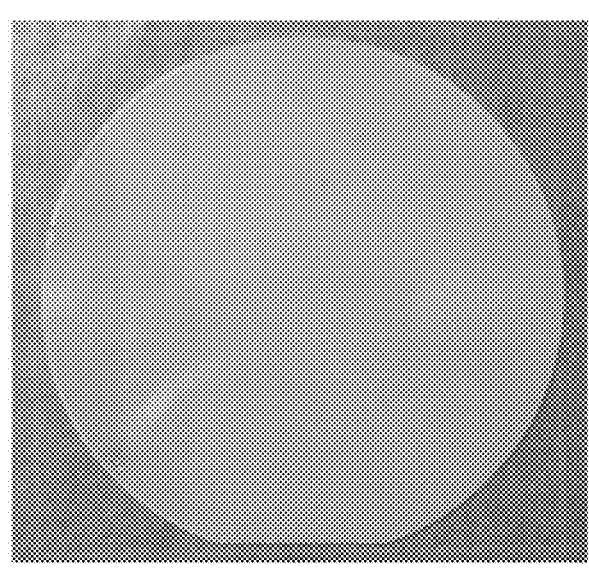
FIG. 16 is a photograph of a group III nitride crystal in Example.

A photograph of the produced GaN free-standing substrate is shown in FIG. 16. FIG. 16 shows a GaN substrate cut out from a region close to the interface between liquid-phase grown seed crystal and the HVPE-grown crystal. FIG. 16 shows that a 2-inch substrate is formed without penetration pits formed due to rupture of Na inclusion.

Figure 17B:
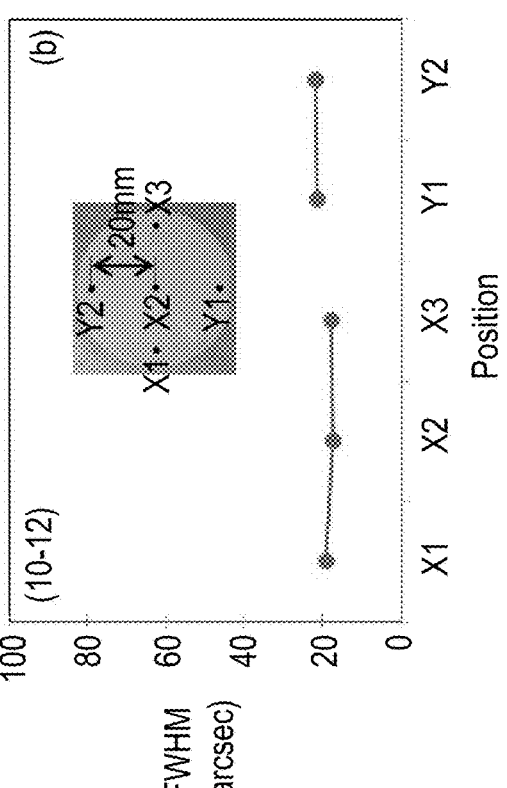
FIG. 17B is a graph showing an in-plane distribution of full width at half maximum of an X-ray ω-SCAN rocking curve of the group III nitride crystal in Example.
Figure 17A:
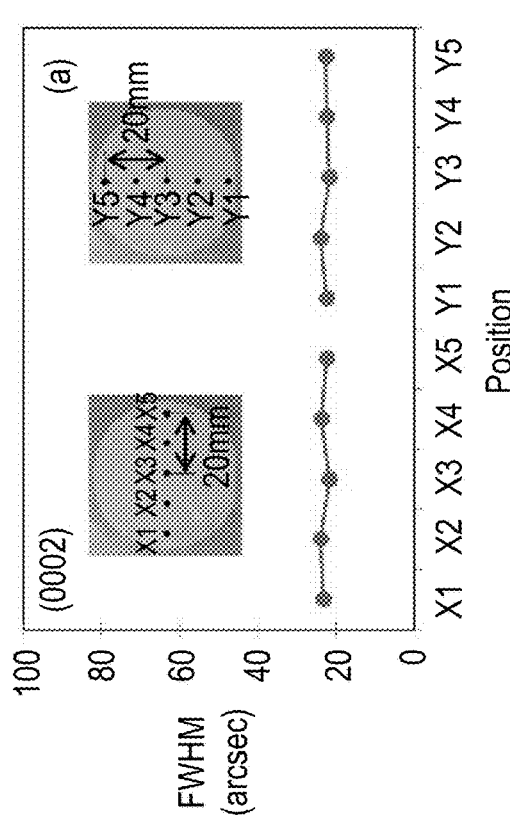
FIG. 17A is a graph showing an in-plane distribution of full width at half maximum of an X-ray ω-SCAN rocking curve of the group III nitride crystal in Example.

FIGS. 17A and 17B show the in-plane distribution of full width at half maximum of the X-ray ω-SCAN rocking curve of the 2-inch GaN free-standing substrate. The average value of full width at half maximum in the surface of the substrate for the (0002) plane in FIG. 17A was 22.8 arcsec, and the average value of full width at half maximum in the surface of the substrate for the (10-12) plane in FIG. 17B was 19.4 arcsec. The HVPE growth resulted in a better value of full width at half maximum than the value of the liquid-phase grown GaN crystal seed substrate. In addition, the radius of curvature of the crystal estimated from the diffraction peak of the (0002) plane was as good as 66 m, which was equivalent to the value of the liquid-phase grown GaN crystal seed substrate.

Figure 18:
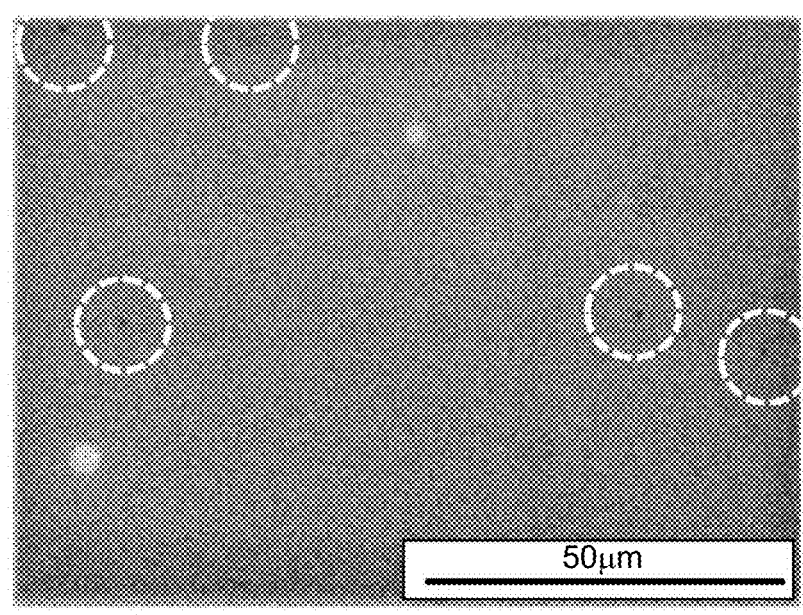
FIG. 18 is a photograph showing results of cathodoluminescence of the surface dislocation density of the group III nitride crystal in Example.

FIG. 18 shows the result of cathodoluminescence measurement of the surface of the produced GaN free-standing substrate. In FIG. 18, dark spots surrounded by white dotted lines correspond to dislocations. The density of the dark spot corresponding to dislocation in FIG. 18 was calculated to be $5.5×10^4$ $cm^{-2}$. In addition, the average dislocation density of the results of randomly measuring the dislocation densities in the surface of the substrate was $1.7×10^5$ $cm^{-2}$.

FIG. 19 shows numerical values converted from the dislocation densities in the surface of the GaN free-standing substrate of FIG. 16, and the dislocation densities are obtained from an image obtained by two-photon photoluminescence measurement. In the measurement of FIG. 19, five points including the center and four points located at 20 mm from the center in the surface were measured in a range of 1 mm×1 mm (inserted view in FIG. 19). One measurement is performed in a region of 0.25 mm×0.25 mm. The region of 1 mm×1 mm is measured by continuously measuring the region of 0.25 mm×0.25 mm at 4×4 locations. The numerical values shown in FIG. 19 indicate the dislocation densities observed in each 0.25 mm×0.25 mm region. The average value at each point is also shown in the drawing. The dislocation density estimated in the 0.25 mm×0.25 mm region was $3.9×10^5$ $cm^{-2}$ at the highest, and the in-plane uniformity was relatively good. In addition, the average dislocation density was $1.2×10^5$ $cm^{-2}$, which was a value lower by more than or equal to one digit than the value of the GaN free-standing substrate produced by the conventional HVPE method. This value was close to the result of the cathodoluminescence measurement shown in FIG. 18. Measurement and evaluation of two-photon photoluminescence are also performed on the dislocation density of the back surface of the GaN free-standing substrate of Example. The dislocation density of the back surface was $1.3\times10^5$ cm$^{-2}$, which was almost the same as the value of the front surface. The difference in dislocation density between the front surface and the back surface was $4.8\times10^5$ cm$^{-2}$, which was a slight difference. In general, a GaN free-standing substrate produced by the HVPE method tends to have a reduced dislocation density in the stacking direction as shown in FIG. 1. However, a large change in dislocation density induces crystal warpage, and therefore, a small difference in dislocation density is preferable.

Figure 20:
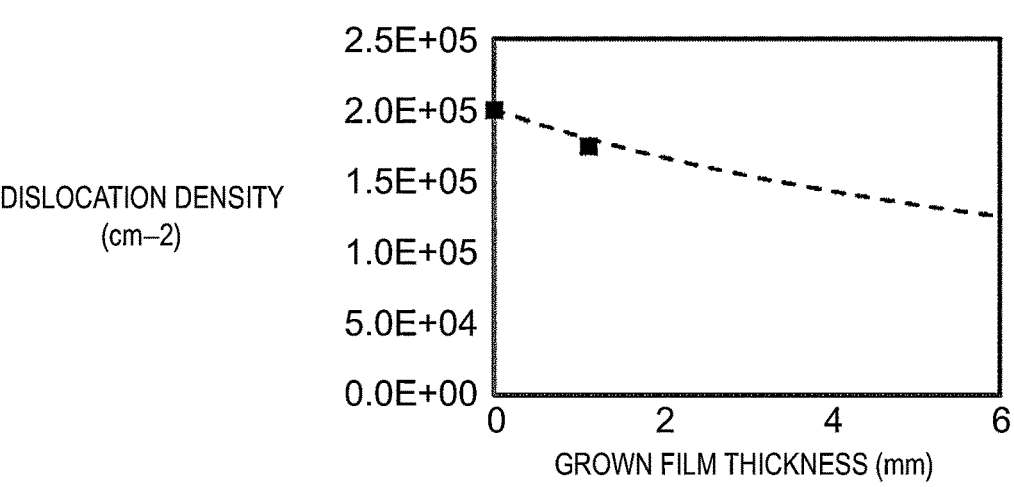
FIG. 20 is a graph showing a relationship between the film thickness and the dislocation density of a group III nitride crystal grown on a nitride seed substrate having a surface dislocation density of $2.0 \times 10^5$ cm$^{-2}$ in the group III nitride crystal according to the first exemplary embodiment.
Figure 21:
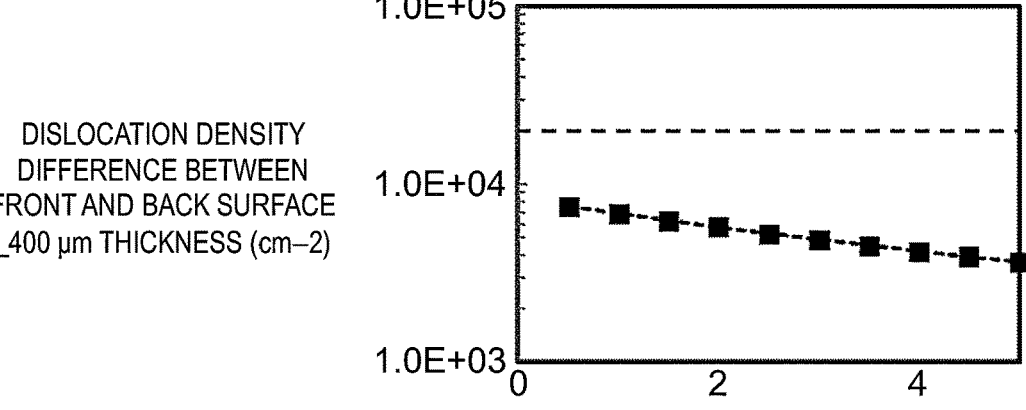
FIG. 21 is a graph showing a relationship between the film thickness of a group III nitride crystal grown on a group III nitride seed substrate having a surface dislocation density of $2.0 \times 10^5$ cm$^{-2}$ and difference in dislocation density between the front and back surfaces of a group III nitride crystal obtained by cutting out a nitride crystal from the grown nitride crystal in a region of each film thickness and shaping the cut-out nitride crystal into a thickness of 400 μm in Example.

The surface dislocation density of the liquid-phase grown GaN crystal seed substrate used in this Example is $2.0\times10^5$ cm$^{-2}$. The dislocation density of the GaN free-standing substrate formed by HVPE growth as shown in FIG. 20 tends to change in inverse proportion to the grown film thickness of the GaN crystal. The plots in FIG. 20 are the results of this Example. In addition, the dotted line indicates the dislocation density that changes in inverse proportion to the film thickness. From the results of FIG. 20, when the GaN crystal is sliced into a large number of sheets of crystals and each crystal is shaped to produce a GaN free-standing substrate having a thickness of 400 µm, the difference in dislocation density between the front surface and the back surface is considered to be as shown in FIG. 21. Therefore, the difference in dislocation density between the front surface and the back surface is less than or equal to $2.0\times10^4$ cm$^{-2}$, indicated by the dotted line in FIG. 21 in all the film thickness regions.

Figure 22:
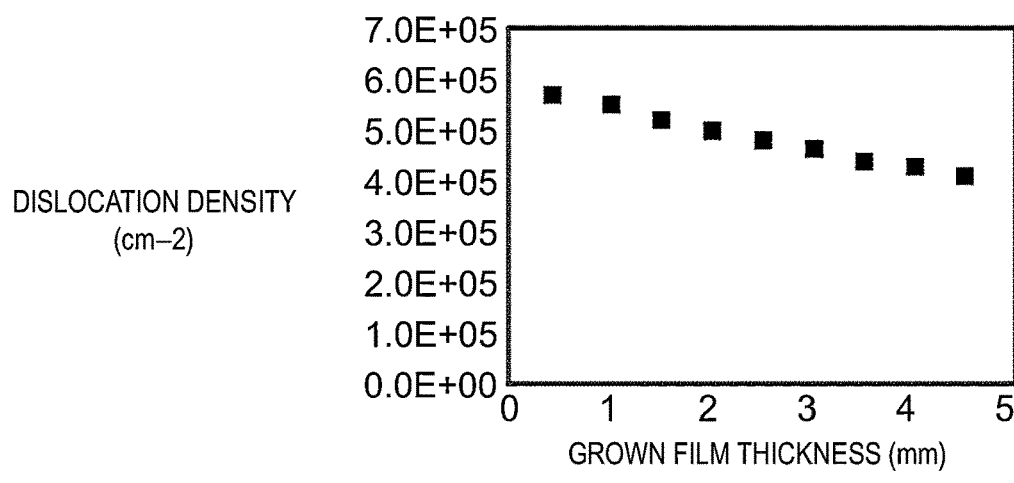
FIG. 22 is a graph-related diagram showing a relationship between the film thickness and the dislocation density of a group III nitride crystal grown on a nitride seed substrate having a surface dislocation density of $6.0 \times 10^5$ cm$^{-2}$ in Example.
Figure 23:
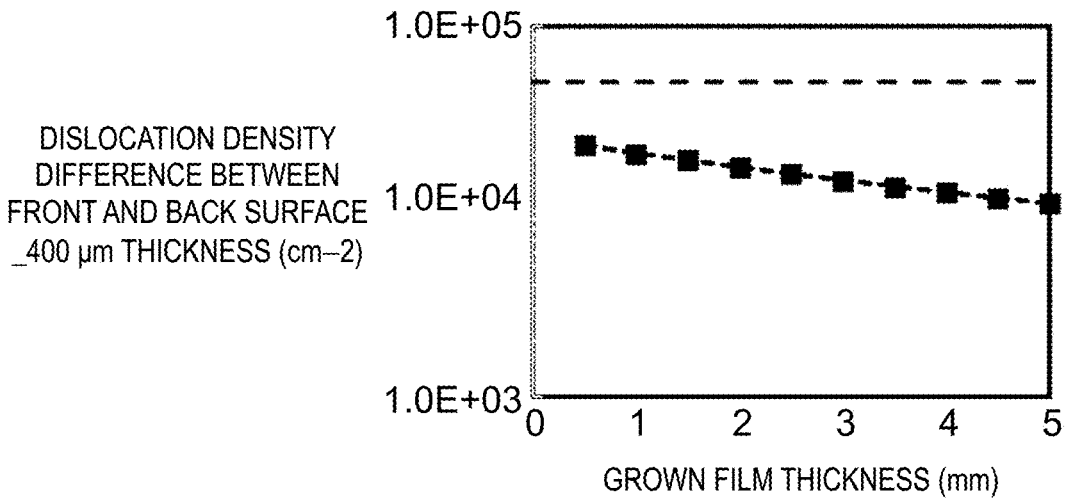
FIG. 23 is a graph showing a relationship between the film thickness of a group III nitride crystal grown on a group III nitride seed substrate having a surface dislocation density of $6.0 \times 10^5$ cm$^{-2}$ and a difference in dislocation density between the front and back surfaces of a group III nitride crystal obtained by cutting out a nitride crystal from the grown nitride crystal in a region of each film thickness and shaping the cut-out nitride crystal into a thickness of 400 μm in Example.

When a GaN free-standing substrate is produced by changing only the surface dislocation density of the liquid-phase grown GaN crystal seed substrate to $6.0\times10^5$ cm$^{-2}$ under exactly the same conditions as described above, the change in dislocation density with respect to the GaN free-standing substrate grown by HVPE tends to be as shown in FIG. 22. From the results of FIG. 22, when a GaN free-standing substrate having a thickness of 400 µm is produced by slicing and shaping a large number of GaN crystals as in the case of FIG. 21, the difference in dislocation density between the front surface and the back surface is as shown in FIG. 23. Even in this case, the difference in dislocation density between the front surface and the back surface is less than or equal to $5.0\times10^4$ cm$^{-2}$ indicated by the dotted line in FIG. 23.

When the difference in dislocation density between the front and back surfaces is small as in Example, the radius of curvature of the crystal axis of the GaN free-standing substrate is more than or equal to 30 µm because the GaN free-standing substrate basically takes over the characteristics of the liquid-phase grown GaN crystal seed substrate.

Comparative Example_Main Growth

A liquid-phase grown GaN crystal seed substrate having a surface dislocation density of $2.0\times10^5$ cm$^{-2}$, the substrate being the same as the GaN crystal seed substrate used in Example, was heat-treated at 740° C. under the same conditions as in Example. Thereafter, initial growth was performed with a thickness of 110 µm at 950° C., and the temperature was raised to 1,035° C. at 10° C./min while the growth under the initial growth conditions was maintained. Thereafter, a GaN crystal with a thickness of 1.1 mm was grown by changing the supply flow rate to 0.26 slm of HCl gas, 1.8 slm of NH$_3$ gas, 44.0 slm of N$_2$ carrier gas, and 10.5 slm of H$_2$ carrier gas, and supplying gases. The growth rate was 200 µm/h, and the rotation speed was 500 rpm.

Figure 24:
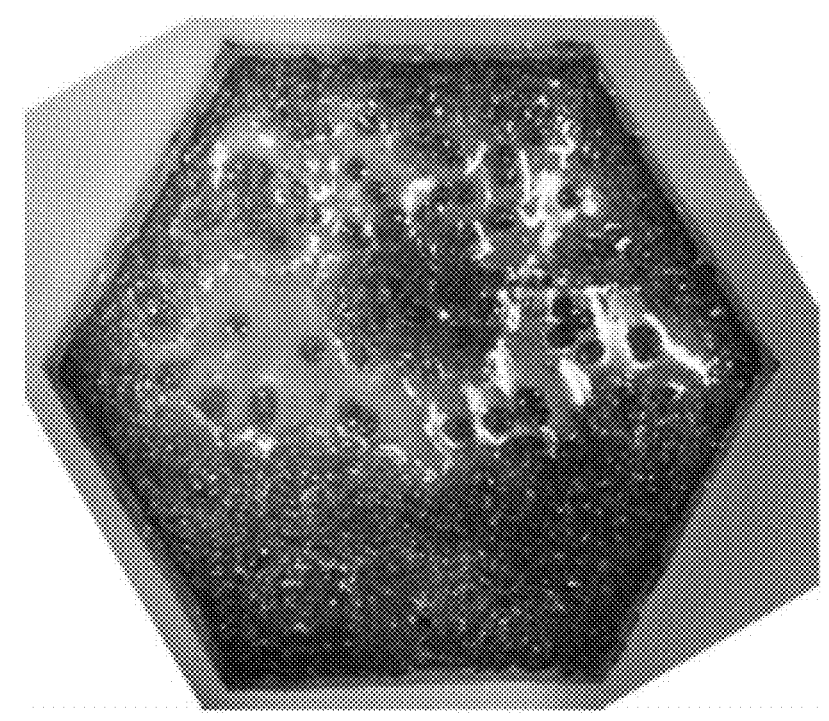
FIG. 24 is a photograph of a group III nitride crystal having a thickness of 1.1 mm in Comparative Example.

FIG. 24 shows a photograph of a GaN crystal after the growth on the liquid-phase grown GaN crystal seed substrate in Comparative Example. In Comparative Example, the growth temperature was set to a high temperature of 1,035° C. in the main growth step unlike Example, and thus rupture of Na inclusion could not be suppressed, resulting in occurrence of surface roughness.

Further, from the electron microscope image of the cross section of the GaN crystal of Comparative Example shown in FIG. 25, it was confirmed that an upper GaN grown film is three-dimensionally grown from the site of Na inclusion. An attempt was made to measure the X-ray ω-SCAN rocking curve, but the surface roughness was too large, and the crystallinity was poor and measurement was impossible. In addition, since the surface was roughened as described above, the surface was cracked by processing in a surface flattening step, thus failing to perform cutting and processing.

Note that the present disclosure includes appropriate combination of arbitrary exemplary embodiments and/or examples among the various exemplary embodiments and/or examples described above, and effects of the respective exemplary embodiments and/or examples can be exhibited.

INDUSTRIAL APPLICABILITY

The group III nitride crystal according to the present disclosure has high quality, and thus can be used for high-performance group III nitride devices.

REFERENCE MARKS IN THE DRAWINGS 100 group III nitride crystal production apparatus
101 group III nitride seed substrate
102 initial growth crystal
103 main growth crystal
110 reaction chamber
111 first nozzle
112 second nozzle
113 third nozzle
114 group III raw material chamber
115 chloride gas introduction nozzle
116 susceptor
117 exhaust unit

The invention claimed is:
1. A group III nitride crystal comprising:
a main surface; and
a back surface opposite to the main surface,
wherein the main surface has an average dislocation density of less than or equal to $6.0\times10^5$ cm$^{-2}$, and the back surface has an average dislocation density of less than or equal to $6.0\times10^5$ cm$^{-2}$;
a difference between the average dislocation density of the main surface and the average dislocation density of the back surface is less than or equal to $5.0\times10^4$ cm$^{-2}$; and
a warpage of a crystal axis of the main surface has a radius of curvature of more than or equal to 30 m.
2. The group III nitride crystal according to claim 1, wherein the main surface has an average dislocation density of less than or equal to $2.0\times10^5$ cm$^{-2}$ and the back surface has an average dislocation density of less than or equal to $2.0\times10^5$ cm$^{-2}$; and
a difference between the average dislocation density of the main surface and the average dislocation density of the back surface is less than or equal to $2.0\times 10^4$ cm$^{-2}$.

3. The group III nitride crystal according to claim 1, wherein the group III nitride crystal has a thickness of 0.3 mm or more and 1.0 mm or less.

4. A group III nitride semiconductor comprising:

the group III nitride crystal according to claim 1; and a group III nitride semiconductor element stacked on the group III nitride crystal.

5. A group III nitride substrate comprising:

a group III nitride seed substrate containing Na; and the group III nitride crystal according to claim 1, the group III nitride crystal being stacked on the group III nitride seed substrate.

6. The group III nitride substrate according to claim 5, wherein the group III nitride crystal has a film thickness of more than or equal to 0.5 mm.

7. A method for producing a group III nitride crystal, the method comprising:

a preparation step of preparing a group III nitride seed substrate containing Na; and a growth step of growing a group III nitride crystal on the group III nitride seed substrate by vapor phase growth, wherein a start temperature of the growth step is 950° C. or higher and 970° C. or lower; and growth of the group III nitride crystal in the growth step is performed at a temperature of 950° C. or higher and 1,020° C. or lower.

8. The method for producing a group III nitride crystal according to claim 7, further comprising a surface treatment step of surface-treating the group III nitride seed substrate containing Na at a temperature of 720° C. or higher and 900° C. or lower.

9. The method for producing a group III nitride crystal according to claim 8, wherein the surface treatment step is performed at 720° C. or higher and 750° C. or lower.

10. The method for producing a group III nitride crystal according to claim 7, wherein growth of the group III nitride crystal in the growth step is performed at a growth rate of more than or equal to 100 μm/h by controlling a supply amount of a source gas and a temperature of the group III nitride crystal.

11. The method for producing a group III nitride crystal according to claim 7, wherein the growth step is performed until a film thickness of the group III nitride crystal reaches more than or equal to 0.5 mm.

12. The method for producing a group III nitride crystal according to claim 7, further comprising a processing step of slicing and polishing the group III nitride crystal grown on the group III nitride seed substrate.

13. A group III nitride crystal produced by a method comprising:

a preparation step of preparing a group III nitride seed substrate containing Na; and a growth step of growing a group III nitride crystal on the group III nitride seed substrate by vapor phase growth, wherein a start temperature of the growth step is 950° C. or higher and 970° C. or lower; and growth of the group III nitride crystal in the growth step is performed at a temperature of 950° C. or higher and 1,020° C. or lower.

* * * * *